United States Patent
Lachapelle et al.

(10) Patent No.: US 10,736,241 B1
(45) Date of Patent: Aug. 4, 2020

(54) TEMPERATURE BASED PRESSURE SENSING AND AIRFLOW CONTROL

(71) Applicant: Amazon Technologies, Inc., Seattle, WA (US)

(72) Inventors: Alan Joseph Lachapelle, Reston, VA (US); Matthew Gangemi, Seattle, WA (US); Vikneshan Sundaralingam, Seattle, WA (US); Suresh Soundararaj, Newcastle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 97 days.

(21) Appl. No.: 15/872,596

(22) Filed: Jan. 16, 2018

(51) Int. Cl.
*H05K 7/20* (2006.01)
*G05B 15/02* (2006.01)

(52) U.S. Cl.
CPC ......... *H05K 7/20836* (2013.01); *G05B 15/02* (2013.01); *H05K 7/20745* (2013.01)

(58) Field of Classification Search
CPC . H05K 7/20836; H05K 7/20745; G05B 15/02
USPC ........................................................ 700/300
See application file for complete search history.

(56) References Cited

U.S. PATENT DOCUMENTS

| | | | | |
|---|---|---|---|---|
| 4,646,964 A | * | 3/1987 | Parker | G05D 23/1902 236/49.3 |
| 5,031,515 A | * | 7/1991 | Niemela | F24F 7/08 454/236 |
| 6,041,853 A | * | 3/2000 | Edayoshi | F24F 1/0007 165/122 |
| 10,010,014 B1 | * | 6/2018 | Lachapelle | H05K 7/20718 |
| 10,165,710 B1 | * | 12/2018 | Pompei | H05K 7/20745 |
| 2010/0141063 A1 | * | 6/2010 | Oh | F04D 25/082 310/62 |
| 2011/0018206 A1 | * | 1/2011 | Beele | F16L 5/04 277/316 |
| 2012/0167670 A1 | * | 7/2012 | Bean, Jr. | H05K 7/20745 73/40.5 R |
| 2012/0279233 A1 | * | 11/2012 | Chainer | H05K 7/20781 62/3.6 |

(Continued)

OTHER PUBLICATIONS

U.S. Appl. No. 16/014,508, filed Jun. 21, 2018, Titled: "Differential Temperature Based Pressure Sensing and Airflow Control".

*Primary Examiner* — Rocio Del Mar Perez-Velez
*Assistant Examiner* — Alicia M. Choi
(74) *Attorney, Agent, or Firm* — Kilpatrick Townsend & Stockton LLP

(57) ABSTRACT

A cooling system, e.g. for a hot aisle/cold aisle datacenter system, can detect local pressure differences between the hot and cold aisle by way of a conduit containing a temperature sensor positioned between the hot aisle and cold aisle. The temperature sensor can detect a temperature of airflow between the aisles by the temperature sensor in the conduit. This conduit is defined by a frame or insert that includes a first opening and a second opening separated by a nonzero distance and that is configured to penetrate a containment element separating the hot aisle and cold aisle. The cooling system can, based on the interstitial temperature, determine a direction of flow of the airflow between the hot region and the cold region and detect recirculation between the hot region and the cold region based on the direction of flow.

24 Claims, 12 Drawing Sheets

(56) References Cited

U.S. PATENT DOCUMENTS

| | | | |
|---|---|---|---|
| 2013/0307225 A1* | 11/2013 | Boyd | F16L 5/04 |
| | | | 277/615 |
| 2014/0049905 A1* | 2/2014 | Manzer | H05K 7/20836 |
| | | | 361/679.46 |
| 2014/0083660 A1* | 3/2014 | McDermott | F28D 7/106 |
| | | | 165/154 |
| 2014/0120825 A1* | 5/2014 | Lin | H05K 7/20709 |
| | | | 454/184 |
| 2014/0298839 A1* | 10/2014 | Nagamatsu | H05K 7/20745 |
| | | | 62/186 |
| 2014/0330447 A1* | 11/2014 | VanGilder | G05D 23/1917 |
| | | | 700/300 |
| 2015/0031282 A1* | 1/2015 | Nagan | F24F 7/007 |
| | | | 454/329 |
| 2016/0195856 A1* | 7/2016 | Spero | G06N 5/046 |
| | | | 700/90 |
| 2017/0087956 A1* | 3/2017 | Graaf | B60H 1/00921 |
| 2018/0037092 A1* | 2/2018 | Lin | B60H 1/3428 |
| 2018/0063997 A1* | 3/2018 | Klein | H05K 7/20745 |

* cited by examiner

TEMPERATURE BASED PRESSURE SENSING AND AIRFLOW CONTROL

BACKGROUND

A datacenter typically contains a collection of computer servers and components for the management, operation and connectivity of those servers. Even in isolation, datacenter electronic components may generate sufficient heat that temperature management is important to prolong the life of the components and smooth and continuous operation of the datacenter.

Datacenter electronic components are often arranged together. For example, datacenter electronic components can be vertically arranged in racks or within server cabinets. When heat-generating electronic components are arranged together, however, the cumulative generation of heat can increase the ambient temperature and exacerbate the challenge of managing the temperature of individual components.

Datacenter electronic components may be cooled by passing air through the components. In some cases, this cooling is achieved by having individual components or groups of components equipped with fans that push air through the components. The effectiveness of a cooling system is related to the rate of airflow past the heat-generating components and the relative temperature of the air as it passes through the system. Therefore it can be advantageous to carefully control airflow to drive cool air where it is most needed and to efficiently exhaust hot air from the system. One such system for controlling airflow in a cooling system is a hot aisle/cold aisle system, which employs contained aisles to direct cooling air into the components. Such systems, however, may be sensitive to temperature spikes resulting from failures in containment or underpressure in the cold aisle, which can detrimentally impact the rate of circulation.

BRIEF DESCRIPTION OF THE DRAWINGS

Various embodiments in accordance with the present disclosure will be described with reference to the drawings, in which.

DETAILED DESCRIPTION

Figure 1:
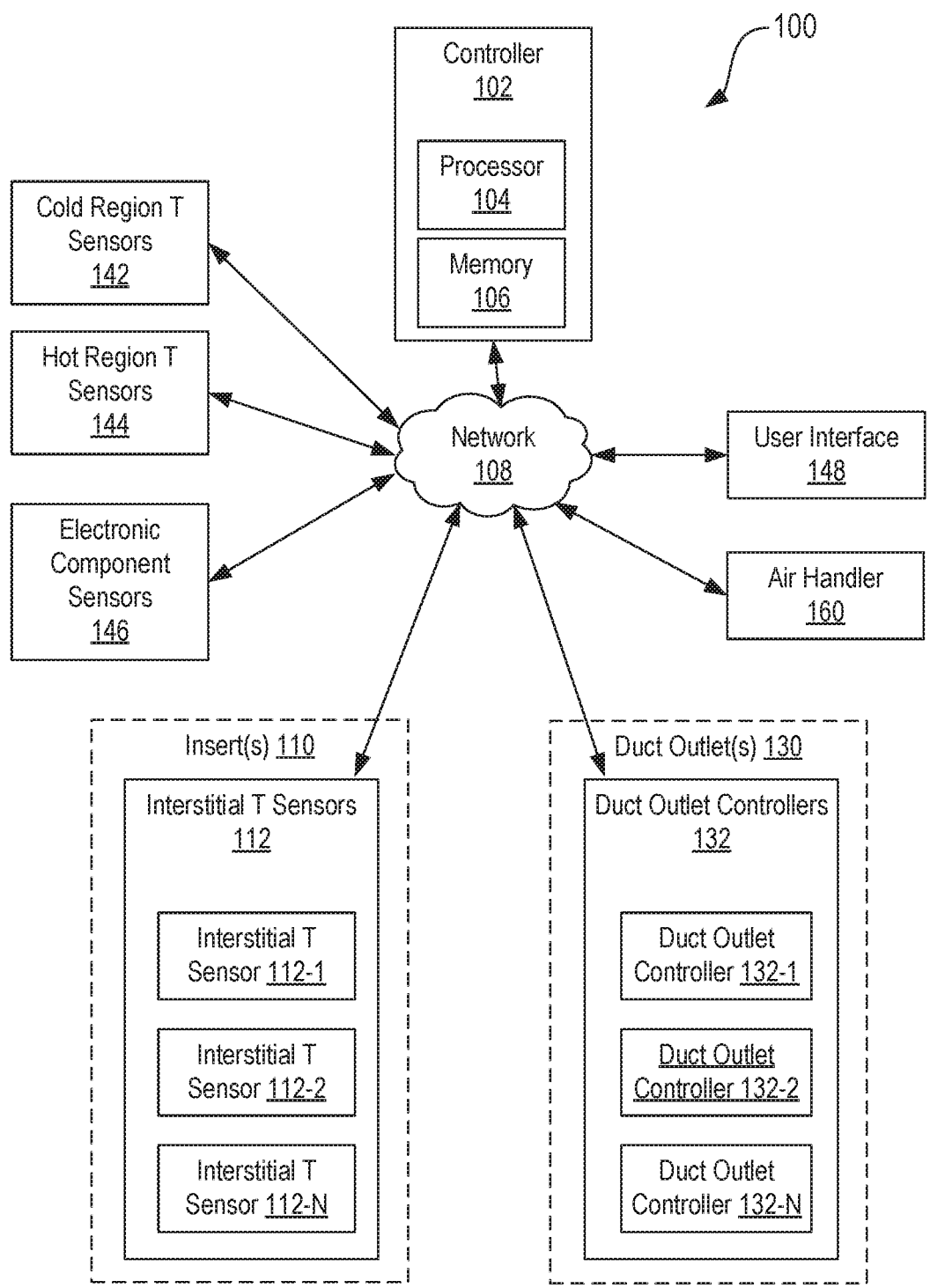
FIG. 1 is a simplified block diagram illustrating a system for managing temperature-based pressure monitoring in a hot aisle/cold aisle cooling system, in accordance with various embodiments.

In the following description, various embodiments will be described. For purposes of explanation, specific configurations and details are set forth in order to provide a thorough understanding of the embodiments. However, it will also be apparent to one skilled in the art that further embodiments may be practiced without the specific details. Furthermore, well-known features may be omitted or simplified in order not to obscure the embodiment being described.

Cooling systems generally operate by providing a flow of a working fluid that absorbs and removes heat from the components to be cooled. In systems such as datacenters, some examples of components to be cooled include servers and power management components. Similar cooling systems may be used for various other applications such as cooling personal computers, vehicles, power production facilities, for home or commercial cooling and ventilation systems, and the like. In most cases, the working fluid must be moved by way of a fan, pump, or other actuator local to the device to be cooled, e.g. cooling fans contained in or adjacent to datacenter electronic components.

Although airflow can be enhanced at the component level by fans, larger cooling systems such as those present in datacenters often use regional or aisle-based cooling systems instead of or in tandem with local cooling fans. One commonly employed system uses a cold aisle, which is a contained space adjacent to the air inlets of many heat-generating electronic components. This cold aisle receives a cold flow of air, often drawn from outside the datacenter. The cold flow of air can exit the cold aisle through or past the heat-generating electronic components, where it passes into a "hot aisle," from which it is then exhausted. Employing a hot aisle/cold aisle arrangement advantageously provides more efficient cooling than merely circulating local air, and can work in tandem with local fans to ensure that temperatures remain in a suitable range with relatively low energy expenditure. However, in order for this arrangement to function, the cold aisle must typically be at a higher pressure than the hot aisle, so that the direction of airflow is generally from the cold aisle toward the hot aisle through the components.

In accordance with various embodiments of the present disclosure, an insert can be positioned in or around the containment elements separating a cold region or cold aisle from a hot region or hot aisle. The insert is sufficiently narrow so that air passing from one region to the other flows in only one direction through most of the insert. Inside an interior conduit of the insert, a temperature sensor is positioned and configured to detect the temperature of this flow of air between the two regions through the insert. The system can use this interstitial temperature to determine whether the cold aisle has depressurized based on this temperature, e.g., if the cold aisle is at or above the correct pressure, then cold air will flow through the insert and the temperature sensor will read a low temperature. The system can indicate proper circulation when the temperature at the insert is approximately equal to the temperatures in cold aisle. If the cold aisle is at a lower pressure than the hot aisle, or if a local break in containment has caused recirculation between the cold and hot aisles, then warm air may flow back from the hot aisle to the cold aisle, resulting in a high temperature reading at the temperature sensor.

Detecting pressure differential based on temperature in this manner can be advantageous over detecting pressure directly. In a typical hot aisle/cold aisle system, the difference in pressure between the aisles that helps to drive airflow may be fairly small, on the order of about 5 Pa to 7.5 Pa (0.02-0.03" $H_2O$). This pressure difference can be difficult to measure over the containment element. However, in various embodiments, the temperature difference between the hot aisle and the cold aisle can be on the order of about 12° C., or more. For example, a typical cold aisle temperature may be about 28° C., compared with a typical hot aisle temperature of about 40° C. In some cases, temperature differences can be much larger, e.g. for a datacenter drawing cool air from an exterior environment in a cold climate.

Various specific configurations of an insert are described herein, and may be used in conjunction with any suitable aisle-based cooling system to sense pressure fluctuations between hot and cold regions or aisles, and even to enable or automate the response to a low pressure event. For example, in some example systems as described herein, an array of temperature-sensing inserts can be positioned at multiple points in a cold aisle. When used as described above to detect whether there is sufficient pressure in the cold aisle, the system can further use data concerning the locations where pressure fluctuations have been detected, and cause the system to compensate by adjusting a rate at which the cold airflow is released.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Turning now to the drawings, in which like numbers denote like parts between figures, FIG. 1 is a simplified block diagram illustrating a system 100 for managing temperature-based pressure monitoring in a hot aisle/cold aisle cooling system, in accordance with various embodiments. The system 100 includes a controller 102 which includes a processor 104 and memory 106 that, when accessed by the processor, contain instructions for managing components of the system. The controller can communicate with the various components of the system 100 by way of a network 108, which can be any suitable form of wireless network (e.g. Bluetooth, WiFi, or the like) or wired network, or combination, including direct connection between the controller 102 and any suitable component.

Various environmental sensors can communicate temperature information with the controller 102, e.g. cold region temperature sensors 142 positioned in a cold region on one side of a containment element, hot region temperature sensors 144 positioned in a hot region on an opposite side of the containment element, or electronic component sensors 146 which denote temperature monitoring elements of the heat-generating electronic components that are cooled by the cooling system.

The system includes at least one, potentially several inserts 110 that are inserted into a containment element where they form a conduit from the cold aisle to the hot aisle, and corresponding interstitial temperature sensor(s) 112 positioned within the conduits (i.e. interstitial temperature sensors 112-1, 112-2, 112-N, cumulatively 112). The system can also include at least one, potentially several duct outlets 130, each with a corresponding duct outlet controller 132 (i.e., duct outlet controllers 132-1, 132-2, 132-N). In various embodiments, the number of interstitial temperature sensors may match the number of duct outlets and corresponding controllers for a given cold region or cold aisle; or in some cases, may match the number of duct outlets for a given containment element. For example, in various embodiments, the system controls a cooling system having a cold aisle with a long containment element (i.e., a wall, divider, or other element above or adjacent the electronic components) separating the cold aisle from a hot aisle, with one or more interstitial temperature sensors positioned at conduits in the containment element.

The specific number of interstitial temperature sensors can vary depending on the length of the cold aisle, but can be one sensor per containment element, two sensors positioned at or near opposite ends of the containment element, three sensors arrayed in a spaced configuration at the ends and approximate middle of the containment element, or other suitably distributed configuration. The number of duct outlets and corresponding duct outlet controllers can be the same as the number of sensors, with a sensor corresponding to each duct outlet. In some embodiments, more duct outlets may be present than the number of sensors, in which case at least one and possibly more than one duct outlet can be associated with each sensor. Sets of sensors can be placed in two or more containment elements of the same cold aisle wherever the cold aisle is separated from a hot aisle by way of a containment element, thus, duct outlets may each correspond to more than one interstitial temperature sensor. Further details concerning the cold aisle/hot aisle layouts are described below with reference to FIG. 3.

The system 100 can also, in some embodiments, include an air handler 160 that provides the airflow to each cold aisle, and a user interface 148 for accessing temperature information, for generating indications for presentation to users concerning temperature readings; and for issuing instructions to users, e.g. instructions to manually adjust aspects of the cooling system, such as duct outlet configurations and the like.

Figure 2:
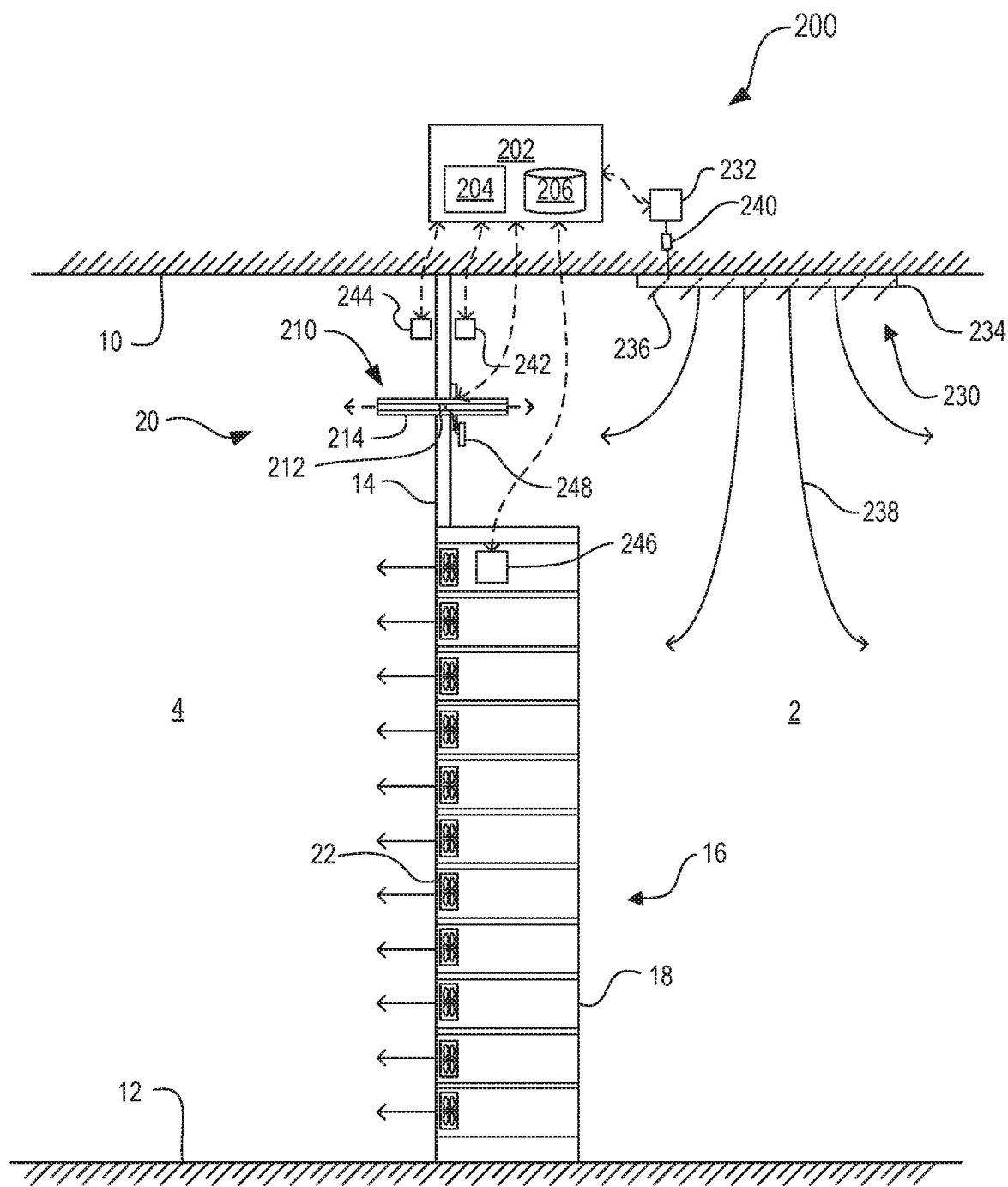
FIG. 2 is a side view diagrammatical illustration of a hot aisle/cold aisle system employing a temperature-based air pressure monitoring insert, in accordance with various embodiments.

FIG. 2 is a side view diagrammatical illustration of a hot aisle/cold aisle system 200 employing a temperature-based air pressure monitoring insert 210, in accordance with various embodiments. The system 200 is based on a cold aisle/hot aisle configuration defining cold aisle 2 and a hot aisle 4 separated by an electronic component rack 16 and containment element 14. The electronic component rack 16 and containment element 14 span from a floor 12 to ceiling 10 of the system 200 and effectively isolate the hot and cold aisles 2, 4 from one another, whereby the only paths provided for airflow between the two are through the electronic components 18 of the rack 16 and through the insert 210. Each electronic component 18 is typically heat-generating, and may include fans 22 for directing air through the electronic component rack 16 from the cold aisle 2 to the hot aisle 4.

The system 200 includes a controller 202 (analogous to controller 102, FIG. 1) that includes at least one processor 204 and memory 206, which is operably connected with and able to control or collect data from the various components of the system 200. A cold aisle sensor 242 can be positioned in the cold aisle 2 for taking temperature readings of the cold aisle, and a hot aisle sensor 244 positioned in the hot aisle 4. In addition, the system 200 can include component sensors 246 in one or more of the electronic components 18 for collecting temperature information at the components.

An insert 210 is positioned piercing the containment element 14 above the electronic component rack 16. The insert can be inserted at a variety of locations (explored in further detail with reference to FIGS. 4-7), but can generally be installed wherever there is suitable clearance. In some embodiments, the insert 210 is placed in the containment element 14 in a utility space 20 shared by various networking or air handling components like ducts, wires, or structural elements above the electronic component rack 16. In some embodiments, the insert 210 can be placed below the electronic component rack 16, between racks, or within empty spaces of racks.

The insert 210 includes a frame 214 defining a conduit through the containment element 14 and an interstitial temperature sensor 212 positioned within the frame along the conduit, so that air passing between the cold aisle 2 and hot aisle 4 by way of the conduit passes over the temperature sensor. In various embodiments, the interstitial temperature sensor 212 can communicate temperature data with the controller 202, e.g. by way of a network or wired connection. In some embodiments, the interstitial temperature sensor 212 can output temperature data for display to a user at a display device 248.

The system 200 also includes air handling components such as an air handler (not shown) for delivering a flow of cold air 238 to the cold aisle 2 by way of a cold air outlet 230. The cold air outlet 230 includes an outlet frame 234 containing a means for controlling the rate of airflow therefrom, such as but not limited to dampers 236. In various embodiments, the orientations of the dampers 236 can be controlled for adjusting the flow rate of the flow of cold air 238 from the cold air outlet 230, either manually by a user or automatically. For example, in various embodiments, the dampers 236 can be connected with an outlet controller 232 by way of an adjustment mechanism 240 or actuator, so that the degree by which the dampers are opened can be detected and controlled by the controller 202 via the outlet controller 232.

Figure 3:
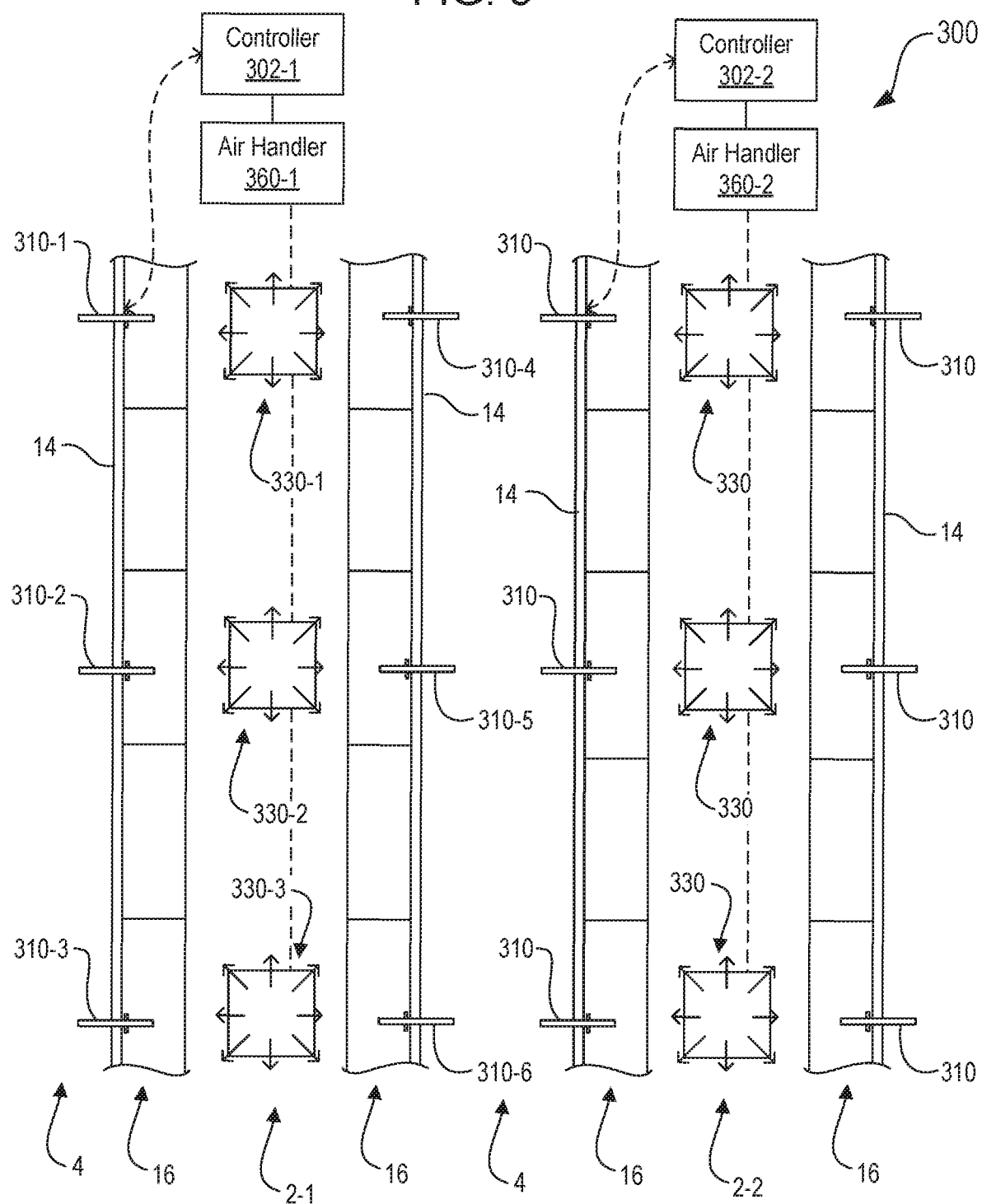
FIG. 3 is a top view diagrammatic illustration of a hot aisle/cold aisle system employing an array of temperature-based air pressure monitoring inserts, in accordance with various embodiments.

FIG. 3 is a top view diagrammatic illustration of a hot aisle/cold aisle system 300 employing an array of temperature-based air pressure monitoring inserts 310, in accordance with various embodiments. The system 300 is analogous to system 200 described above with respect to FIG. 2, showing multiple hot aisles 4 and cold aisles 2-1, 2-2 in a repeating arrangement, and showing multiple inserts 310 and cold air outlets 330 in each cold aisle. In some alternative embodiments, additional cold aisles 2 and hot aisles 4 may be added to extend the cooling system 300, and the length of each cold aisle may be extended and provided with additional inserts 310 and cold our outlets 330.

Focusing on the first cold aisle 2-1, the aisle is bordered by two electronic component racks 16 with associated containment elements 14 for restricting airflow out of the cold aisle 2-1 to paths passing through the component racks for cooling. A first air handler 360-1 generates a cold airflow to three distributed cold air outlets 330-1, 330-2, 330-3, from which the cold air exits to pressurize the cold aisle 2-1. An array of inserts 310 is distributed along both sides of the cold aisle 2-1 through the containment elements 14, with each insert being associated with a respective cold air outlet 330. For example, as shown, inserts 310-1 and 310-4 are associated with outlet 330-1, inserts 310-2 and 310-6 with outlet 330-2, and inserts 310-3 and 310-6 with outlet 330-3.

A variety of alternative arrangements of cold air outlets 330 are possible and within the spirit of this disclosure, including embodiments having one or two outlets per cold aisle 2, for example, or embodiments having an arbitrary number of cold air outlets depending on the length of the cold aisle, and the frequency with which cold air outlets are needed to adequately pressurize the aisle. Similarly, inserts 310 can be positioned along the containment elements 14 at any suitable spacing, with a higher number of inserts per unit length being capable of resolving local pressure losses with greater granularity than a low number of inserts. In some embodiments, two inserts 310 are positioned at or near opposite ends of each containment element 14; and in at least some other embodiments, three inserts 310 are positioned in a distributed manner along each containment element 14 as shown in FIG. 3.

In various embodiments, each cold aisle 2 can be monitored by a respective controller 302 for that aisle (e.g. controllers 302-1, 302-2 for cold aisles 2-1, 2-2); or a single controller may monitor and control aspects of multiple cold aisles. Likewise, multiple air handlers 360-1, 360-2 may be configured to independently supply each cold aisle 2-1, 2-2, or a single air handler may supply multiple cold aisles.

The interstitial temperature sensors (112, 212, 312) described above with respect to FIGS. 1-3 can be incorporated directly in structures of the containment element 14, or may be incorporated by way of an insert placed in the containment wall. FIGS. 4-7 describe several examples of inserts containing interstitial temperature sensors for use in systems like the systems 100, 200, or 300 of FIGS. 1-3. These inserts may be removable or permanent, and can generally be mounted in an aperture of the containment elements 14 described herein.

Figure 4:
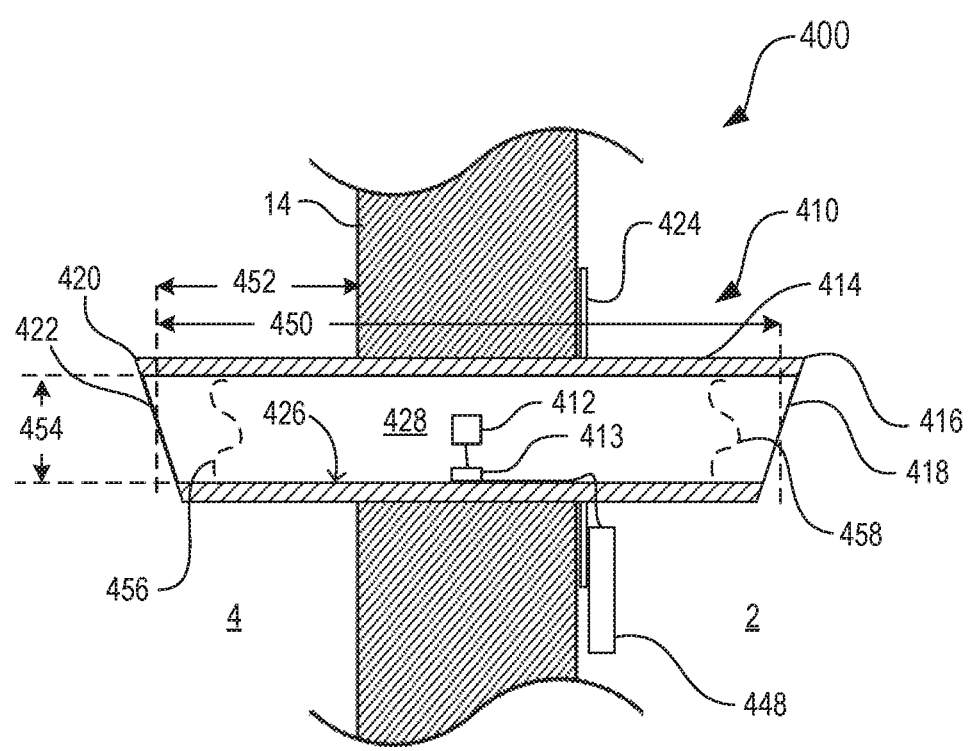
FIG. 4 is a side view diagrammatical illustration of a first example of a temperature-based air pressure monitoring insert for use in a hot aisle/cold aisle system.

FIG. 4 is a side view diagrammatical illustration of a first example of a temperature-based air pressure monitoring insert 410 for use in a hot aisle/cold aisle system 400, in accordance with various embodiments. The insert 410 is mounted through a containment element 14, i.e. a wall or divider that otherwise restricts airflow from the cold aisle 2 to the hot aisle 4. The insert 410 includes a frame 414 that defines a conduit 428 via an inner wall 426 of the insert, which extends from a first opening 418 at a first end 416 of the insert to a second opening 422 at a second end 420. The frame 414 can take the form of a pipe, which can be a circular pipe or other suitable shape, extending through the containment element 14.

In use, a flow of air develops between the cold aisle 2 and hot aisle 4 through the conduit 428. The conduit 428 is sufficiently narrow that the airflow is restricted to one direction through the conduit, and will travel at a sufficient rate that the displacement of air through the conduit dominates over heat transfer within the conduit. Thus, the temperature of air within the conduit 428 will be substantially the same as the temperature of the source of the flow of air up to one of two stagnation points 456, 458 where the flow of air begins mixing with the environment, whether that source is the cold aisle 2 or the hot aisle 4. The first stagnation point 456 corresponds with an airflow from the cold aisle 2 to the hot aisle 4, and the second stagnation point 458 corresponds with a reversed airflow from the hot aisle to the cold aisle.

In various embodiments, the diameter 454 of the conduit 728 can be on the order of about 3 mm up to about 25 mm (⅛" to 1"), or approximately 12.5 mm. In various embodiments, the length 450 of the insert 410 can vary from approximately the width of the containment element 14 (i.e. on the order of 1 cm) up to about 6 m (20 feet), though longer inserts may be bent or curved to save space. In some embodiments, the length 750 of the insert 710 can vary from about 4.5-6 m (15-20 feet), or from about 1.5-3 m, or in some specific embodiments, about 1 m in length. The insert 410 can extend away from the containment element 14 by a clearance 452 ranging from zero to several meters. In some embodiments, a sealing element 424, such as a flange or gasket, can be connected with the frame 414 and positioned about the insert 410 so that the sealing element prevents air from flowing around the insert when it is installed in the containment element 14. Practical lengths for such inserts may vary, with some embodiments ranging from slightly longer than the depth of a server rack (or about 1.2 m) to the length from a hot aisle containment element 14 to the center of a row (or about 1.8 m) when used in straight tubing.

The interstitial temperature sensor 412 is mounted within the conduit 428, e.g. to a sidewall 426, between the two stagnation points 456, 458. In some embodiments, the temperature sensor 412 can be connected with an onboard processor 413 for processing temperature data received from the temperature sensor 412; or the temperature sensor can relay temperature data directly from the insert to an external controller (not shown). In some embodiments, the temperature sensor 412 can relay temperature data to a display device 448 associated with the insert 410 for displaying temperature information or other indications, e.g. indications that an interstitial temperature exceeds a threshold, to a user.

Figure 5:
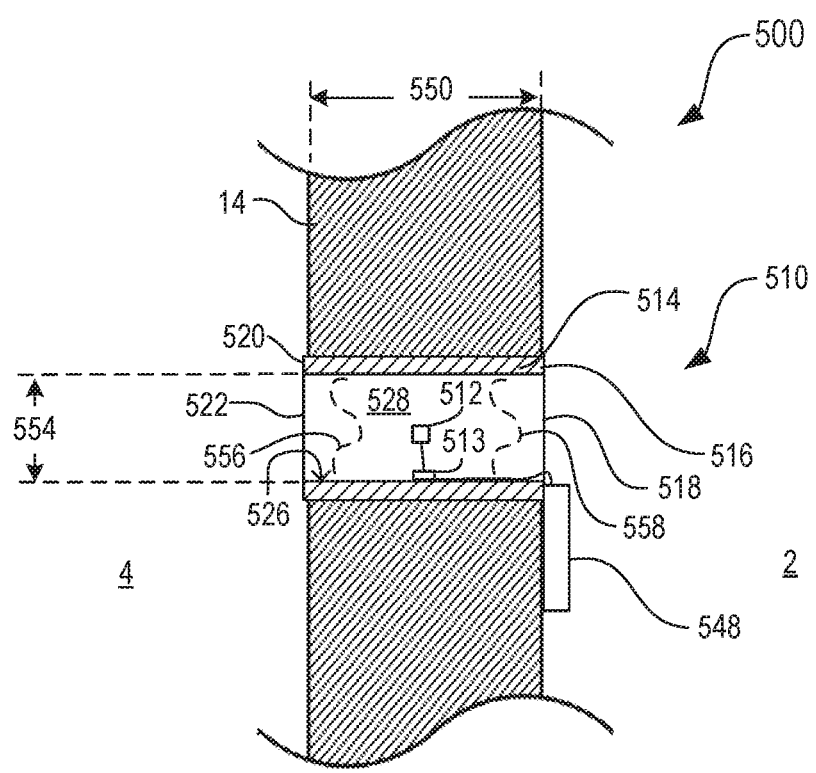
FIG. 5 is a side view diagrammatical illustration of a second example of a temperature-based air pressure monitoring insert.

FIG. 5 is a side view diagrammatical illustration of a second example of a temperature-based air pressure monitoring insert 510 for use in a hot aisle/cold aisle system 500, in accordance with various embodiments, where the insert is contained within the containment element 14. The insert 510, like insert 410 described above, is mounted through a containment element 14. The insert 510 includes a frame 514 that defines a conduit 528 via an inner wall 526 of the insert, which extends from a first opening 518 at a first end 516 of the insert to a second opening 522 at a second end 520. The frame 514 can take the form of a pipe, which can be a circular pipe or other suitable shape, extending through the containment element 14.

As described above, the interstitial temperature sensor 512 is mounted between first and second stagnation points 556, 558 near ends 516, 520 of the insert. Provided the conduit 528 is sufficiently narrow to restrict airflow to one direction in the conduit, these stagnation points can remain adequately separated to permit the use of the temperature sensor 514 even when the length 550 of the insert 510 is very short, e.g. on the order of centimeters. A suitable conduit width 554 can vary from about 3 mm up to about 25 mm, depending on the expected flow rate and the length of the conduit 528.

In some embodiments, the temperature sensor 512 can be connected with an onboard processor 513 for processing temperature data received from the temperature sensor 512; or the temperature sensor can relay temperature data directly from the insert to an external controller (not shown). In some embodiments, the temperature sensor 512 can relay temperature data to a display device 548 associated with the insert 510 for displaying temperature information or other indications to a user.

Figure 6:
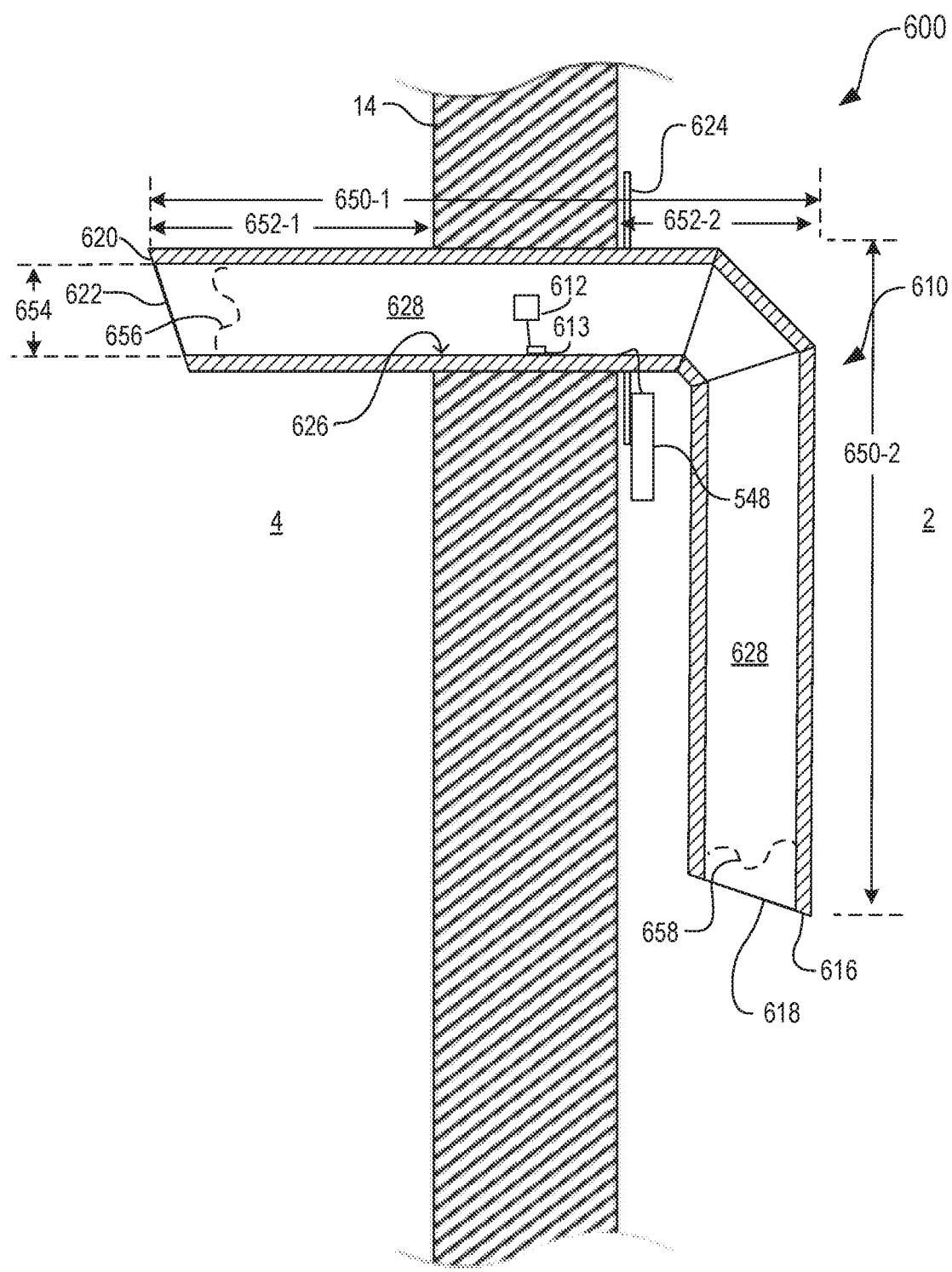
FIG. 6 is a side view diagrammatical illustration of a third example of a temperature-based air pressure monitoring insert.

FIG. 6 is a side view diagrammatical illustration of a third example of a temperature-based air pressure monitoring insert 610 for use in a hot aisle/cold aisle system 600, in accordance with various embodiments, where the insert is shaped to avoid turbulence or localized differences in pressure. The insert 610, like inserts 410, 510 described above, is mounted through a containment element 14. The insert 610 includes a frame 614 that defines a conduit 628 via an inner wall 626 of the insert, which extends from a first opening 618 at a first end 616 of the insert to a second opening 622 at a second end 620. The frame 614 can take the form of a pipe, which can be a circular pipe or other suitable shape, extending through the containment element 14.

As shown, the frame 614 extends in an L-shape manner along a horizontal, first length 650-1 and a vertical, second length 650-2, which is directed along the containment element 14 to avoid turbulence or other disturbances to airflow that would enter the conduit 628 at the first end 618. This shaped approach is particularly useful when the insert 610 is placed directly next to an air outlet (not shown) that may be blowing air toward the insert directly.

In various embodiments, the diameter 754 of the conduit 728 can be on the order of about 3 mm up to about 25 mm (⅛" to 1"), or approximately 12.5 mm. In some embodiments, the length 750 of the insert 710 can vary from about 4.5-6 m (15-20 feet), or from about 1.5-3 m, or in some specific embodiments, about 1 m in length. The insert 610 can extend away from the containment element 14 by a clearance 652-1 in the hot aisle 4 by distances ranging from zero to several meters, and can extend away from the containment element by a comparable second clearance 652-2 on the side of the cold aisle. In some embodiments, a sealing element 624, such as a flange or gasket, can be connected with the frame 614 and positioned about the insert 610 so that the sealing element prevents air from flowing around the insert when it is installed in the containment element 14. With a rotated L-shaped tube, specific insert dimensions can vary, but in some specific embodiments the tube may extend at least 1.2 m into the hot aisle and have a vertical dimension of between 0.3 m and 1.8 m, though many combination of depth and height are possible. In some embodiments, the L-shaped tube extends sufficiently into the hot aisle to clear the top of an electronic component rack (e.g. a server rack), and extends down sufficiently to clear a turbulent region above the rack, as shown with reference to insert 810 (FIG. 8) below. In some embodiments, the L-shaped tube can then extend along any suitable portion of the rack, including toward the lowermost extent near the facility floor.

As described above, the interstitial temperature sensor 612 is mounted between first and second stagnation points 656, 658 inside the conduit 628. In some embodiments, the temperature sensor 612 can be connected with an onboard processor 613 for processing temperature data received from the temperature sensor 612; or the temperature sensor can relay temperature data directly from the insert to an external controller (not shown). In some embodiments, the temperature sensor 612 can relay temperature data to a display device 648 associated with the insert 610 for displaying temperature information or other indications to a user.

Figure 7:
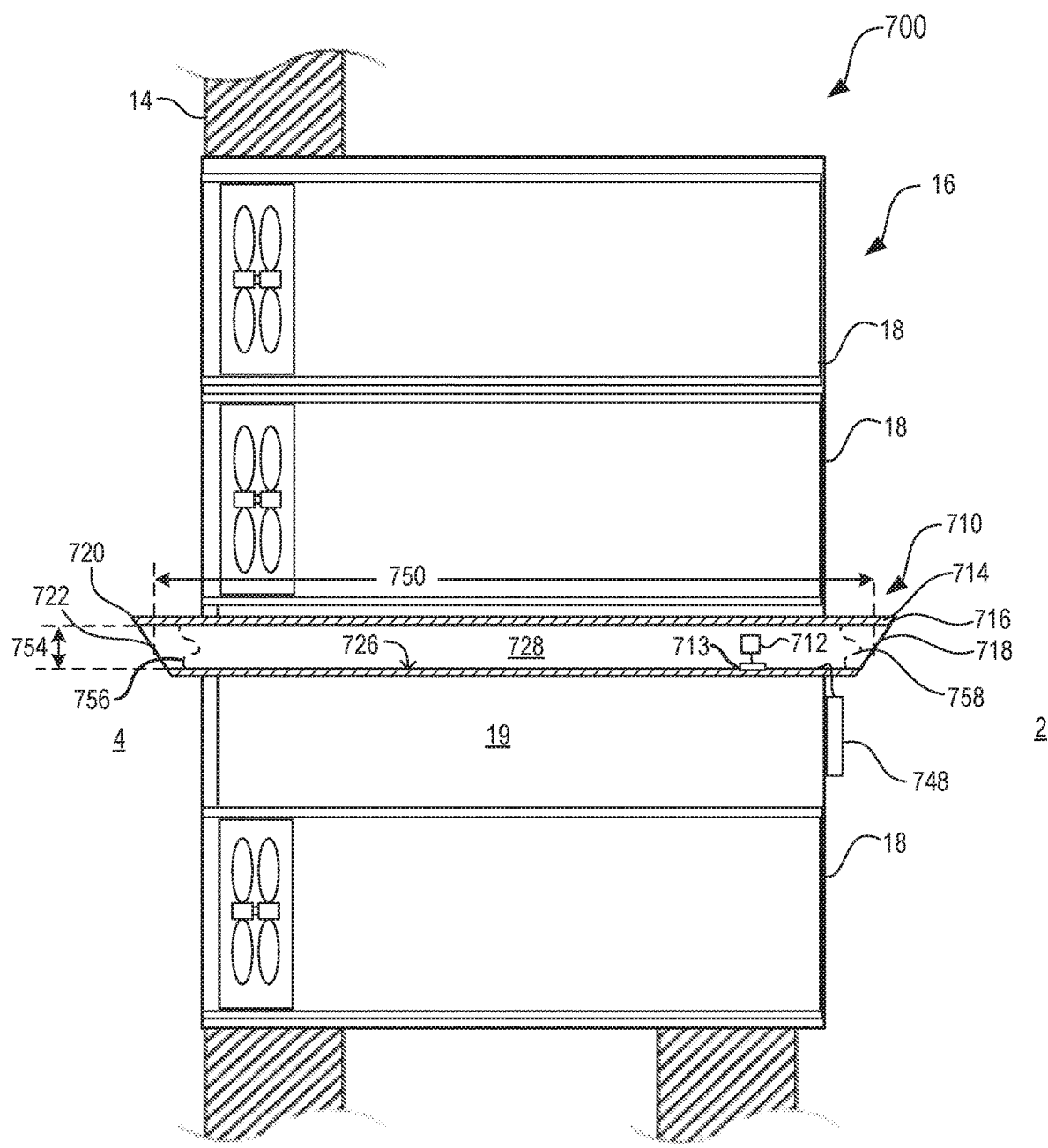
FIG. 7 is a side view diagrammatical illustration of a fourth example of a temperature-based air pressure monitoring insert positioned through an electronic component containment rack.

FIG. 7 is a side view diagrammatical illustration of a fourth example of a temperature-based air pressure monitoring insert 710 positioned through an electronic component containment rack 16 in a hot aisle/cold aisle system 700, in accordance with various embodiments. The insert 710, like inserts 410, 510 described above, is mounted through a containment element 14. The insert 710 includes a frame 714 that defines a conduit 728 via an inner wall 726 of the insert, which extends from a first opening 718 at a first end 716 of the insert to a second opening 722 at a second end 720. The frame 714 can take the form of a pipe, which can be a circular pipe or other suitable shape, extending through the containment element 14. As shown, the frame 714 extends in an elongate manner alongside the electronic components 18 of an electronic component rack 16. In various embodiments, the diameter 754 of the conduit 728 can be on the order of about 3 mm up to about 25 mm (⅛" to 1"), or approximately 12.5 mm. In some embodiments, the length 750 of the insert 710 can vary from about 4.5-6 m (15-20 feet), or from about 1.5-3 m, or in some specific embodiments, about 1 m in length.

As described above, the interstitial temperature sensor 712 is mounted between first and second stagnation points 756, 758 inside the conduit 728. In some embodiments, the temperature sensor 712 can be connected with an onboard processor 713 for processing temperature data received from the temperature sensor 712; or the temperature sensor can relay temperature data directly from the insert to an external controller (not shown). In some embodiments, the temperature sensor 712 can relay temperature data to a display device 748 associated with the insert 710 for displaying temperature information or other indications to a user.

Figure 8:
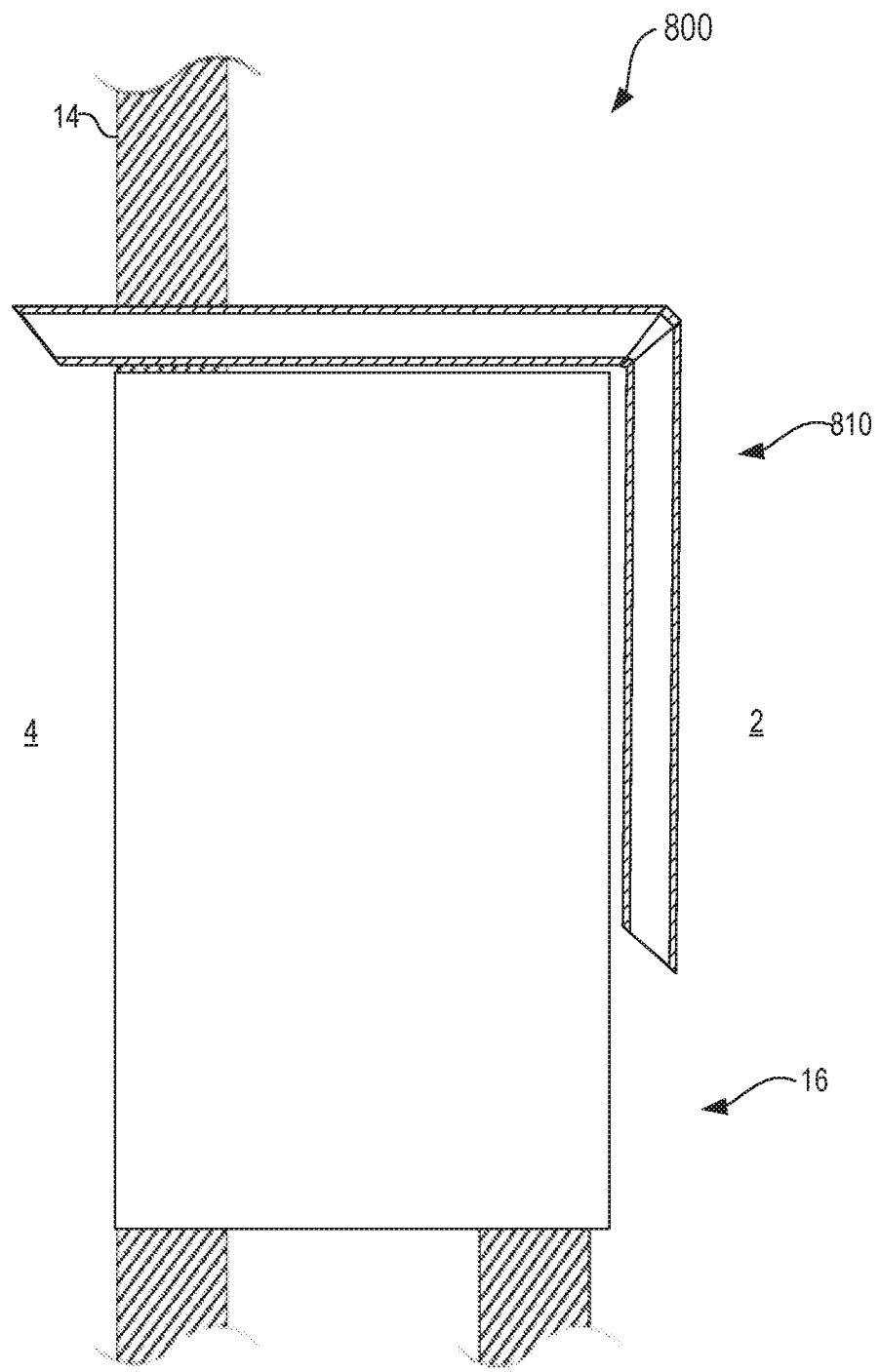
FIG. 8 is a side view diagrammatical illustration of a fifth example of a temperature-based air pressure monitoring insert positioned around an electronic component containment rack.

FIG. 8 is a side view diagrammatical illustration of a fifth example of a temperature-based air pressure monitoring insert 810 positioned around an electronic component containment rack 16 in a hot aisle/cold aisle system 800, in accordance with various embodiments. Aspects of the air pressure monitoring insert 810 are described in detail above with reference to similar inserts 600, 700 shown in FIGS. 6 and 7. Specifically, insert 810 is positioned to run adjacent and around an electronic component containment rack 16 which bridges a containment element 14 between the hot aisle 4 and cold aisle 2. The insert 810 has an L-shaped bend like insert 610 (FIG. 6) having sufficient horizontal extent to wrap around the rack 16, and sufficient vertical extent to avoid turbulence above the rack.

Figure 9:
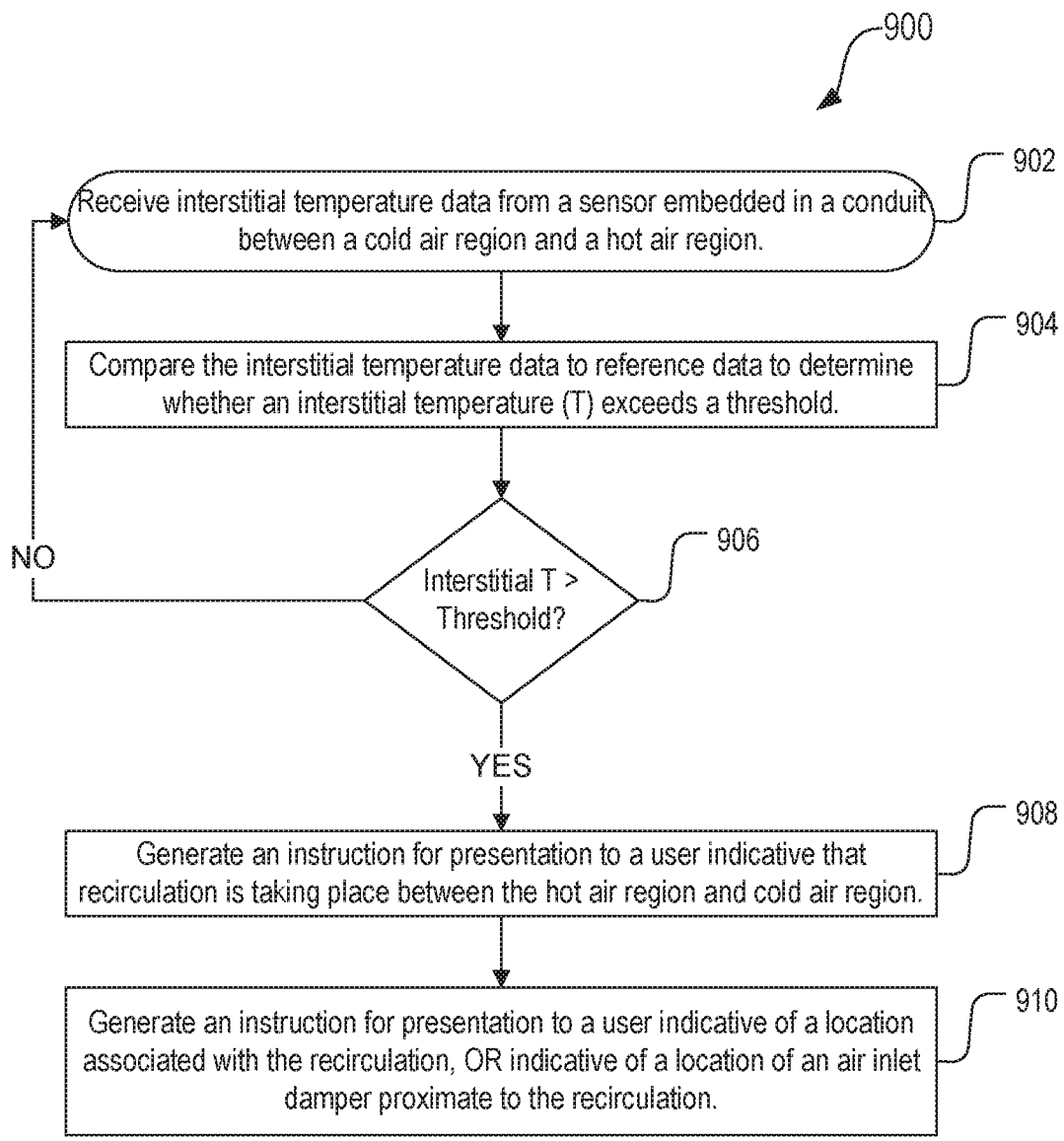
FIG. 9 illustrates a first example process for controlling a cooling system employing a hot aisle/cold aisle system in conjunction with one or more temperature-based air pressure monitoring inserts.

FIG. 9 illustrates a first example process 900 for controlling a cooling system employing a hot aisle/cold aisle system in conjunction with one or more temperature sensors in conduits between the hot and cold aisles, e.g. by way of temperature-based air pressure monitoring inserts, according to various embodiments. Steps shown in the example process 900 can be implemented in accordance with systems for cooling one or more electronic components, for example as shown in systems 100, 200, or 300 of FIG. 1, 2, or 3, and in conjunction with an insert as descried with reference to any of FIGS. 4-8. In particular, the process 900 relates to detecting a low-pressure exception in a hot aisle/cold aisle system.

According to various embodiments, a cooling system can receive interstitial temperature data from a temperature sensor located in a conduit between a cold air region and a hot air region (act 902). This temperature sensor may be positioned in an insert that passes through a containment element of a hot aisle/cold aisle system, as described above with reference to FIGS. 2-7. However, the process 900 can also be implemented based on a temperature sensor positioned directly in an aperture of a containment element.

The system can compare the interstitial temperature data, i.e. a temperature of a flow of air through the conduit, with a threshold (act 904) in order to determine whether the temperature exceeds the threshold (act 906). The case where the temperature does not exceed the threshold is indicative that cool air is flowing from the cold region to the hot region. For cooling systems such as cold aisle/hot aisle air containment systems, this case corresponds with a positive pressure differential from the cold aisle to the hot aisle, which encourages proper cooling airflow through associated devices, and the system will maintain state. The system can periodically, intermittently, or continuously monitor the interstitial temperature.

The case where the temperature does exceed the threshold is indicative that warm air is flowing from the hot region to the cold region through the conduit. For hot aisle/cold aisle air containment systems, this case corresponds to an exception where the pressure in the hot aisle locally exceeds the pressure in the cold aisle, and can result in overheating and damage to components associated with the cold aisle. Potential causes of this exception include, but are not limited to: underpressure in the cold aisle caused by insufficient airflow to the cold aisle, either generally or locally; or overpressure in the hot aisle caused by insufficient venting from the hot aisle. In some cases, a break in air containment may also cause this exception, whereby warm air from the hot aisle may have been allowed to vent from the hot aisle back into the cold aisle; or whereby cold air from the cold aisle has been allowed to vent directly to the hot aisle without passing through the heat-generating components, thus wasting the cold air and raising the local pressure in the hot aisle.

The system can proceed to generate an indication that recirculation from the hot air region to the cold air region has been detected (act 908). In some embodiments, this indication can include a raw temperature reading for display to a used via a user interface device, a temperature reading with a specific indication that the temperature is above the threshold, or an indication that hot air is recirculating through the conduit. In some embodiments, the system can also, or alternatively, generate an instruction for a user indicative of a specific location associated with the detected recirculation (act 910), e.g. in systems that have multiple temperature sensors located at multiple conduits in a cooling/air containment system. In some embodiments, the indication can include an instruction requesting manual intervention to increase the local flow rate of cold air, e.g. by opening a damper of an air outlet near the location where the exception is detected, or alternatively increasing the volume of air provided to the cold region.

Figure 10:
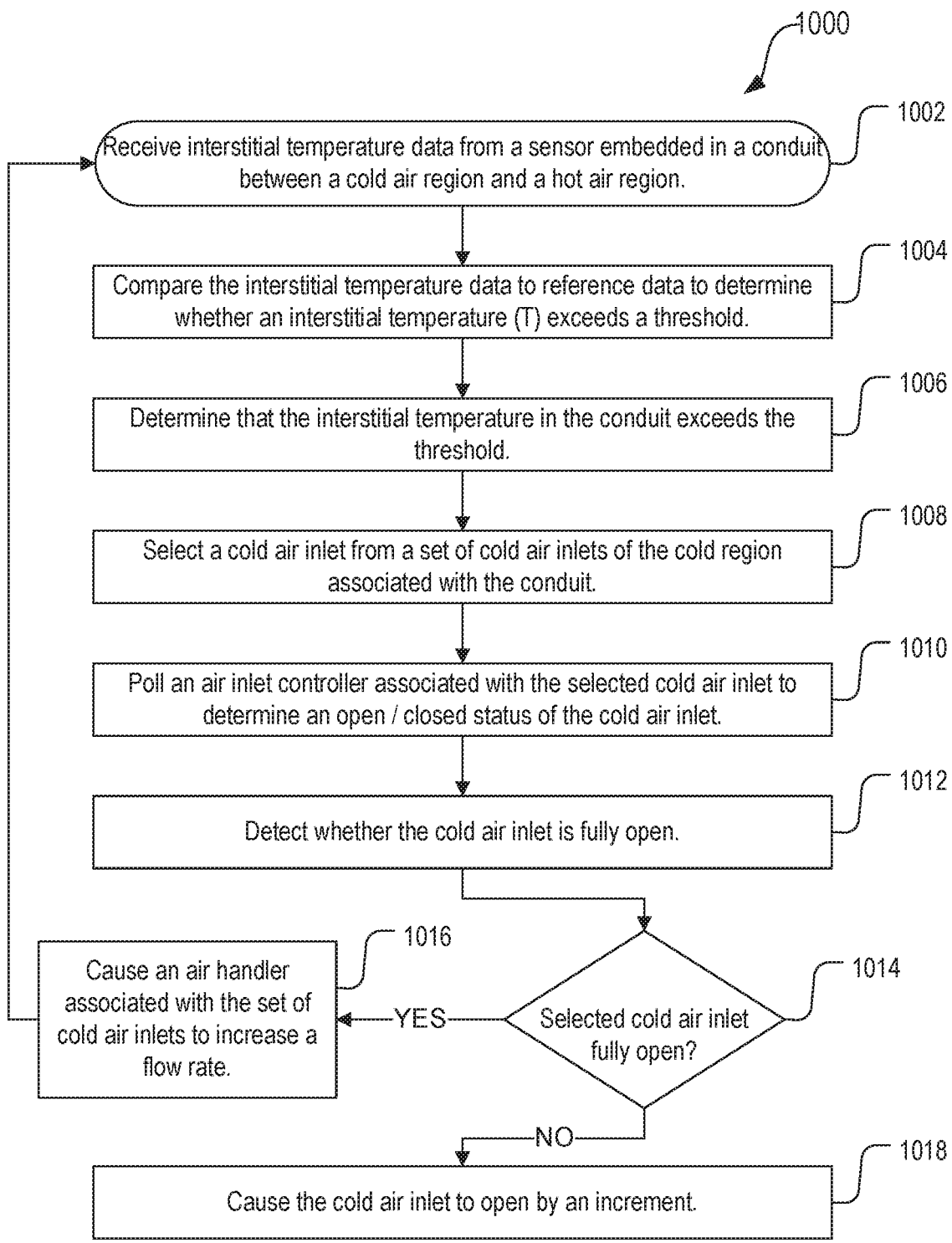
FIG. 10 illustrates a second example process for controlling a cooling system employing a hot aisle/cold aisle system in conjunction with one or more temperature-based air pressure monitoring inserts.

FIG. 10 illustrates a second example process 1000 for controlling a cooling system employing a hot aisle/cold aisle system in conjunction with one or more temperature-based air pressure monitoring inserts, according to various embodiments. Steps shown in the example process 1000 can be implemented in accordance with systems for cooling one or more electronic components, for example as shown in systems 100, 200, or 300 of FIG. 1, 2, or 3, and in conjunction with an insert as descried with reference to any of FIGS. 4-8. In particular, the process 1000 relates to detecting and locating a low-pressure exception in a hot aisle/cold aisle system, and causing a modification to the air handling system to compensate.

According to various embodiments, the cooling system can receive interstitial temperature data from a temperature sensor embedded in a conduit between a cold air region or aisle and a hot air region or aisle (act 1002), as described above. In similar manner, the temperature sensor can be positioned directly in an aperture of a containment element, or can be a component positioned within a conduit of an insert placed in an aperture of the containment element. The system can then compare the interstitial temperature data to reference data in order to determine whether the interstitial temperature exceeds a threshold (act 1004).

In various embodiments, the reference data can be a pre-programmed threshold temperature. Such a predefined threshold temperature can correspond to a temperature target for the cold region or cold aisle, as the process steps outlined below will tend to automatically increase the flow rate of cold air to the cold region until the interstitial temperature is below the threshold. In various other embodiments, the predefined threshold temperature can correspond to any suitable value falling between a desired cold aisle temperature and a desired hot aisle temperature. The specific threshold temperature may fall in a relatively broad range between the cold aisle and hot aisle temperatures in embodiments where the conduit is sufficiently long and narrow, as one-directional convection will dominate over thermal diffusion in a narrow conduit, resulting in an interstitial temperature that is either very close to the cold aisle temperature or very close to the hot aisle temperature.

In some embodiments, the system can determine a threshold temperature based on the hot aisle temperature, the cold aisle temperature, or both, based on temperature data collected from hot aisle and/or cold aisle sensors positioned in the respective aisles. For example, in one embodiment, the system can determine a threshold temperature based on the hot aisle temperature alone, i.e., by setting the threshold approximately at or just below the hot aisle temperature. In another embodiment, the system can set the threshold temperature based on the cold aisle temperature, setting the threshold just above the cold aisle temperature. Or, in some embodiments, the system can select a threshold temperature that is between the hot and cold aisle temperatures, e.g. at a midpoint or other suitable value.

If the system does not detect an interstitial temperature exceeding the threshold, the system can continue to monitor the temperature as described above with reference to FIG. 9. However, in the event of reverse airflow, the system will detect the exception based on the interstitial temperature exceeding the threshold (act 1006). The system can then select a cold air outlet from among the cold air outlets serving the cold aisle that is associated with the sensor in the conduit, i.e. the location of interest (act 1008). In various embodiments, the system will select the cold air outlet having the greatest influence on the air pressure at the location of interest, which is typically the closest to the location at which the recirculation was detected.

The system can poll one or more controllers associated with the cold air outlets to determine their open/closed status, i.e. whether each cold air outlet is fully open, fully closed, or partially open (act 1010). The system can then determine from the controller associated with the selected cold air outlet to determine whether the selected cold air outlet can provide additional air, i.e. whether the cold air outlet is in a fully open position (act 1012). In the event that the selected cold air outlet can be opened further, the system can cause a control mechanism of the selected into to actuate, in order to incrementally open the cold air outlet in order to increase the local pressure of cold air.

In the event that the selected cold air outlet is fully open (act 1014), the system may compensate by a variety of means. For example, in some embodiments, the system can respond by instructing an air handler associated with the cold aisle to increase a flow rate of cold air to the entire cold aisle. Alternatively, the system can respond by partially closing one or more other air outlets in the cold aisle to increase the local pressure to the cold air outlet of interest. Also, as an alternative to causing the action of a control mechanism to close or open the cold air outlet, the system can generate instructions for presentation to a user that instruct a user to manually adjust the flow rate, e.g. by adjusting a damper or valve of the cold air outlet.

Figure 11:
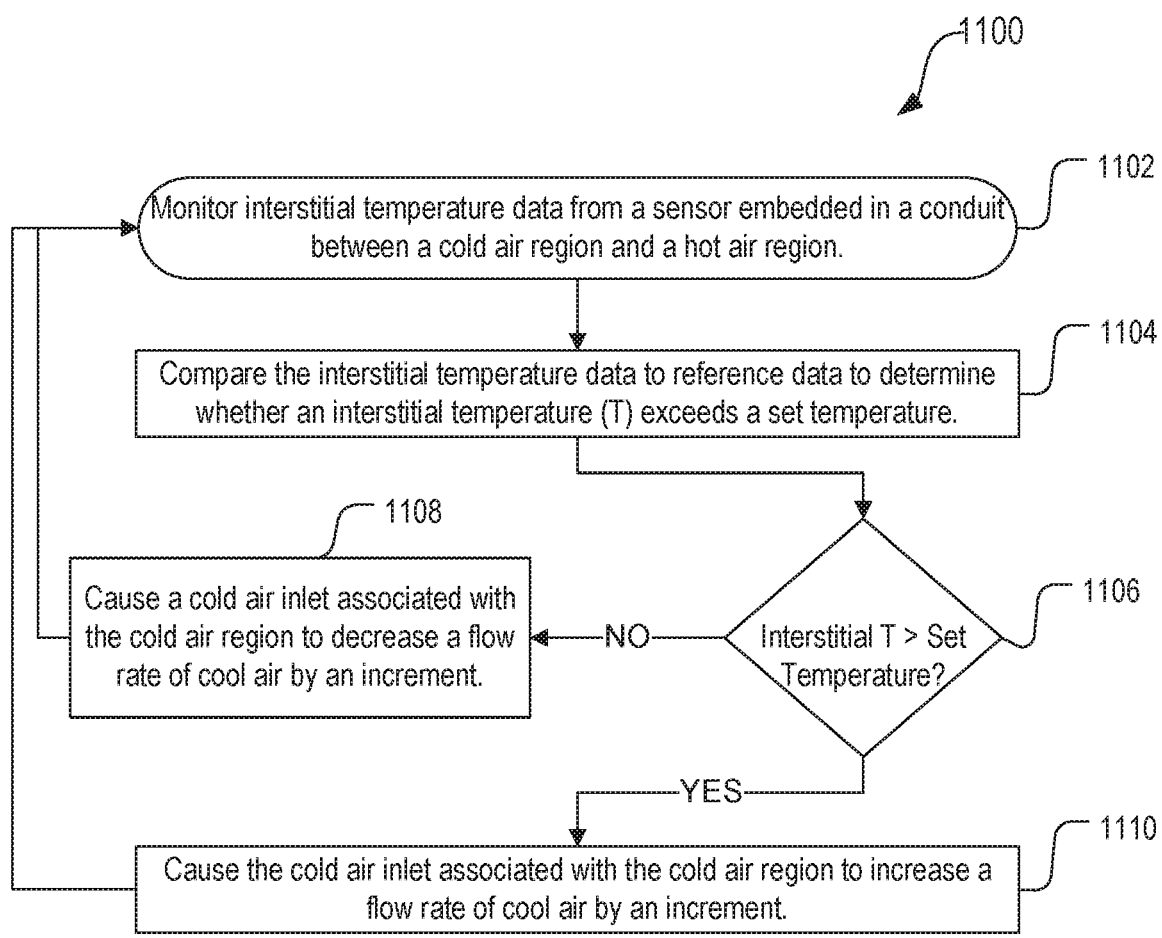
FIG. 11 illustrates a third example process for controlling a cooling system employing a hot aisle/cold aisle system in conjunction with one or more temperature-based air pressure monitoring inserts.

FIG. 11 illustrates a third example process 1100 for controlling a cooling system employing a hot aisle/cold aisle system in conjunction with one or more temperature-based air pressure monitoring inserts, in accordance with various embodiments. Steps shown in the example process 1100 can be implemented in accordance with systems for cooling one or more electronic components, for example as shown in systems 100, 200, or 300 of FIG. 1, 2, or 3, and in conjunction with an insert as descried with reference to any of FIGS. 4-8. In particular, the process 1100 relates to adjusting cold air flow rates in a hot aisle/cold aisle system over time to mitigate waste from overcooling.

According to various embodiments, the cooling system can receive interstitial temperature data from a temperature sensor embedded in a conduit between a cold air region or aisle and a hot air region or aisle (act 1102), as described above. In similar manner, the temperature sensor can be positioned directly in an aperture of a containment element, or can be a component positioned within a conduit of an insert placed in an aperture of the containment element. The system can then compare the interstitial temperature data to reference data associated with a set temperature of the cold aisle in order to determine whether the interstitial temperature exceeds a threshold associate with the set temperature (act 1104). In some embodiments, the set temperature corresponds to a desired temperature of the cold aisle, and the reference temperature is the same as the cold aisle, i.e. as expected when air in the cold aisle is well mixed and is expected to flow to the insert without changing significantly in temperature. In some other embodiments, a reference temperature can be used instead, and set at a remove from the desired temperature in the cold aisle (i.e. a temperature offset) to account for temperature variance around the set temperature.

At regular intervals, the system will determine whether the interstitial temperature exceeds the set or reference temperature (act 1106). When the interstitial temperature (i.e. the sensed temperature in the conduit of the insert) exceeds the set temperature (or reference temperature), the system causes an increase in the rate of cold air flow to the cold aisle (act 1110). This increase in flow rate can be achieved using a variety of means, or a combination of means, as described above, including but not limited to: increasing a flow rate through a damper or similar adjustment mechanism at a local cold air outlet; increasing a total flow rate of cool air to the cold aisle via an air handler, or other means. The adjustment to increase the rate of cooling airflow typically occurs quickly, to prevent overheating in any dependent electronic components, e.g. on the order of seconds to minutes, or from about 10 to 60 seconds.

According to various embodiments, the system can also mitigate energy waste by gradually downgrading the rate of cooling airflow to the cold aisle over time. For example, when the system detects that the interstitial temperature is less than or equal to the set temperature, i.e. not greater than the set temperature or reference temperature, the system can gradually decrease the flow rate of the cool air to the cold aisle (act 1108). In at least one embodiment, the system monitors the interstitial temperature data for at least a set, minimum period of time before downgrading the rate of cooling airflow, e.g. on the order of minutes to hours. In some specific embodiments, the system will only downgrade the rate of cooling airflow when the interstitial temperature is not greater than the set temperature for a predetermined period of time of at least 1 minute, or at least 10 minutes, or in some cases at least 60 minutes. In embodiments of cooling systems having multiple sensors obtaining temperature data from multiple positions along a single cold aisle, the system can collect data from all such sensors and gradually downgrade airflow to the cold aisle based on consistent measurements across all such sensors. Thus, the system will slowly decrease the rate of cooling airflow to a cold aisle for as long as each insert connected with the cold aisle indicates that cold air is uniformly flowing from the cool aisle to the hot aisle and is below the set or reference temperature, and will quickly increase the rate of cooling airflow when an instance of recirculation of hot air to the cold aisle is detected.

Some or all of the processes 900, 1000 or 1100 (or any other processes described herein, or variations, and/or combinations thereof) may be performed under the control of one or more computer systems configured with executable instructions and may be implemented as code (e.g., executable instructions, one or more computer programs, or one or more applications) executing collectively on one or more processors, by hardware or combinations thereof. The code may be stored on a computer-readable storage medium, for example, in the form of a computer program comprising a plurality of instructions executable by one or more processors. The computer-readable storage medium may be non-transitory.

Figure 12:
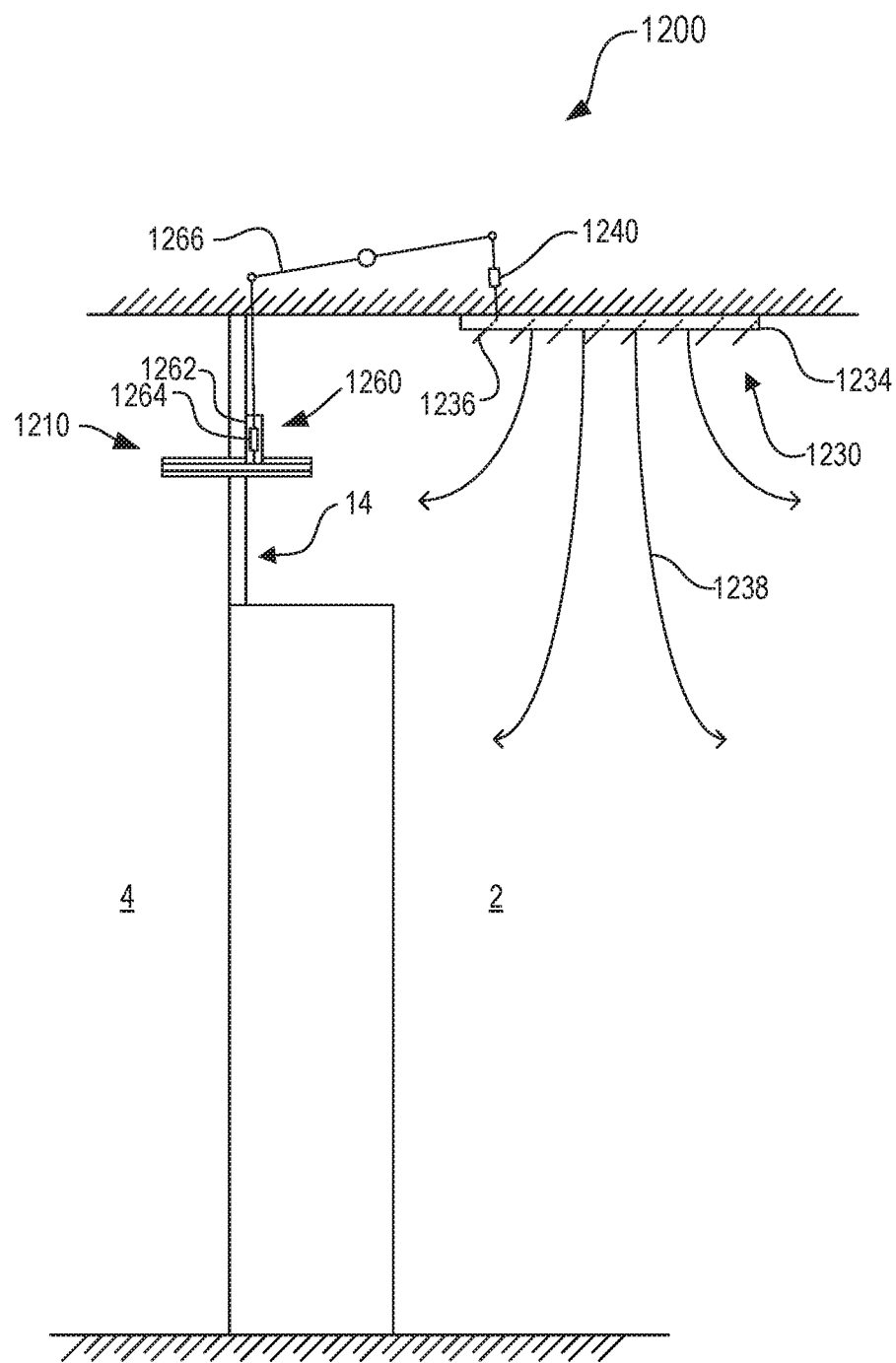
FIG. 12 is a side view diagrammatical illustration of an alternative embodiment of a temperature-based air pressure adjusting insert employing a mechanical sensing apparatus.

In some alternative embodiments, aspects of the above-described controller-managed cooling systems can be replaced with mechanical controls. For example, FIG. 12 is a side view diagrammatical illustration of an alternative embodiment of a cooling system 1200 employing a temperature-based air pressure adjusting insert 1210 employing a mechanical sensing apparatus 1260, in accordance with various embodiments. The mechanical sensing apparatus 1260 includes a casing 1262 containing a temperature-activated actuator 1264 in fluid communication with air flowing through the insert 1210. In operation, the actuator 1264 can activate when air flowing through the insert 1210 exceeds a threshold temperature. When activated, the actuator 1264 can relay mechanical force via a mechanical linkage 1266 to an adjustment mechanism 1240 that controls the airflow rate through a cold air outlet 1230. In some embodiments, the actuator 1240 is a mechanical linkage connected with and configured to open or close dampers 1236 mounted within the frame 1234 of the cold air outlet 1230, so that the degree by which the dampers are opened can be controlled mechanically by the mechanical sensing apparatus 1260 by way of the adjustment mechanism 1240. Various forms of mechanical sensing apparatuses can be used, including, but not limited to: a pneumatic sensing apparatus containing a membrane enclosing a pneumatic fluid that changes volume with temperature or a piston enclosing a temperature-sensitive pneumatic fluid. In either case, the pneumatic fluid is activated by facilitating heat transfer between the fluid and the flow of air in the insert 1210. Some alternative temperature-sensitive mechanisms include: bimetallic elements such as a bimetallic strip that includes two strips of different metals that expand at different rates (e.g., steel/copper, steel/brass, etc.), and thermostatic traps.

Various computing environments may be used, as appropriate, to implement various embodiments as described herein including web- or cloud-based computing environments, computing environments based on local controllers, or combinations of the above. User or client devices can include any of a number of general purpose personal computers, such as desktop or laptop computers running a standard operating system, as well as cellular, wireless and handheld devices running mobile software and capable of supporting a number of networking and messaging protocols. Such an environment also can include a number of workstations running any of a variety of commercially-available operating systems and other known applications for purposes such as development and database management. These workstations also can include other electronic devices, such as dummy terminals, thin-clients, gaming systems and other devices capable of communicating via a network and used for communicating with sensors, displays, actuators, and user interfaces, among other devices.

For example, user interfaces (such as interface 148, FIG. 1) can include any appropriate device operable to send and receive requests, messages, or information over an appropriate network and convey information back to a user of the device. Examples of such devices include portable displays, personal computers, cell phones, handheld messaging devices, laptop computers, set-top boxes, personal data assistants, electronic book readers, and the like. The network can include any appropriate network, including an intranet, the Internet, a cellular network, a local area network, or any other such network or combination thereof. Components used in conjunction with such a network can depend at least in part upon the type of network and/or environment selected. Protocols and components for communicating via such a network are well known and will not be discussed herein in detail. Communication over the network can be enabled by wired or wireless connections and combinations thereof.

Suitable computing environments can include, in various embodiments, a server and data store. It should be understood that there can be several servers, layers, or other elements, processes, or components, which may be chained or otherwise configured, which can interact to perform tasks such as obtaining data, processing said data, and communicating data or with users. For example, according to various embodiments, a controller such as controller 102 (FIG. 1) can include a server and/or a virtual machine emulated by a server. As used herein the term "data store" refers to any device or combination of devices capable of storing, accessing, and retrieving data, which may include any combination and number of data servers, databases, data storage devices, and data storage media, in any standard, distributed, or clustered environment. The server can include any appropriate hardware and software for integrating with the data store as needed to execute aspects of one or more applications for the client device, handling a majority of the data access and logic for an application. The server provides access control services in cooperation with the data store and is able to generate content such as text, graphics, audio, and/or video to be transferred to the user, which may be served to the user by the Web server in the form of HyperText Markup Language ("HTML"), Extensible Markup Language ("XML"), or another appropriate structured language in this example. It should be understood that servers are not required and are merely example components, as structured code discussed herein can be executed on any appropriate device or host machine as discussed elsewhere herein.

The data store can include several separate data tables, databases or other data storage mechanisms and media for storing data relating to a particular aspect. For example, the data store can include a mechanism for storing data for reporting, analysis, or other such purposes. The data store is operable, through logic associated therewith, to receive instructions and obtain, update or otherwise process data in response thereto.

Each server typically will include an operating system that provides executable program instructions for the general administration and operation of that server and typically will include a computer-readable storage medium (e.g., a hard disk, random access memory, read only memory, etc.) storing instructions that, when executed by a processor of the server, allow the server to perform its intended functions. Suitable implementations for the operating system and general functionality of the servers are known or commercially available and are readily implemented by persons having ordinary skill in the art, particularly in light of the disclosure herein.

A computing environment according to various embodiments can be a distributed computing environment utilizing several computer systems and components that are interconnected via communication links, using one or more computer networks or direct connections. However, it will be appreciated by those of ordinary skill in the art that the embodiments discussed above could operate equally well in a computing environment having fewer or a greater number of components, including systems operated under the control of a single computing device in communication with any suitable combination of the various sensors, input/output devices and/or actuators discussed herein.

Most embodiments utilize at least one network that would be familiar to those skilled in the art for supporting communications using any of a variety of commercially-available protocols, such as Transmission Control Protocol/Internet Protocol ("TCP/IP"), Open System Interconnection ("OSI"), File Transfer Protocol ("FTP"), Universal Plug and Play ("UpnP"), Network File System ("NFS"), Common Internet File System ("CIFS"), and AppleTalk. The network can be, for example, a local area network, a wide-area network, a virtual private network, the Internet, an intranet, an extranet, a public switched telephone network, an infrared network, a wireless network, and any combination thereof.

In embodiments utilizing a Web server, the Web server can run any of a variety of server or mid-tier applications, including Hypertext Transfer Protocol ("HTTP") servers, FTP servers, Common Gateway Interface ("CGI") servers, data servers, Java servers, and business application servers. The server(s) also may be capable of executing programs or scripts in response to requests from user devices, such as by executing one or more Web applications that may be implemented as one or more scripts or programs written in any programming language, such as Java®, C, C #, or C++, or any scripting language, such as Perl, Python, or TCL, as well as combinations thereof. The server(s) may also include database servers, including without limitation those commercially available from Oracle®, Microsoft®, Sybase®, and IBM®.

Computing environments as discussed herein can include a variety of data stores and other memory and storage media as discussed above. These media can reside in a variety of locations, such as on a storage medium local to (and/or resident in) one or more of the computers or remote from any or all of the computers across the network. In a particular set of embodiments, the information may reside in a storage-area network ("SAN") familiar to those skilled in the art. Similarly, any necessary files for performing the functions attributed to the computers, servers, or other network devices may be stored locally and/or remotely, as appropriate. Where a system includes computerized devices, each such device can include hardware elements that may be electrically coupled via a bus, the elements including, for example, at least one central processing unit ("CPU"), at least one input device (e.g., a mouse, keyboard, controller, touch screen, or keypad), and at least one output device (e.g., a display device, printer, or speaker). Such a system may also include one or more storage devices, such as disk drives, optical storage devices, and solid-state storage devices such as random access memory ("RAM") or read-only memory ("ROM"), as well as removable media devices, memory cards, flash cards, etc.

Suitable media can also include a computer-readable storage media reader, a communications device (e.g., a modem, a network card (wireless or wired)), an infrared communication device, etc.), and working memory as described above. The computer-readable storage media reader can be connected with, or configured to receive, a computer-readable storage medium, representing remote, local, fixed, and/or removable storage devices as well as storage media for temporarily and/or more permanently containing, storing, transmitting, and retrieving computer-readable information. The system and various devices also typically will include a number of software applications, modules, services, or other elements located within at least one working memory device, including an operating system and application programs, such as a client application or Web browser. It should be appreciated that alternate embodiments may have numerous variations from that described above. For example, customized hardware might also be used and/or particular elements might be implemented in hardware, software (including portable software, such as applets), or both. Further, connection to other computing devices such as network input/output devices may be employed.

Storage media computer readable media for containing code, or portions of code, can include any appropriate media known or used in the art, including storage media and communication media, such as but not limited to volatile and non-volatile, removable and non-removable media implemented in any method or technology for storage and/or transmission of information such as computer readable instructions, data structures, program modules, or other data, including RAM, ROM, Electrically Erasable Programmable Read-Only Memory ("EEPROM"), flash memory or other memory technology, Compact Disc Read-Only Memory ("CD-ROM"), digital versatile disk (DVD), or other optical storage, magnetic cassettes, magnetic tape, magnetic disk storage, or other magnetic storage devices, or any other medium which can be used to store the desired information and which can be accessed by a system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A system for controlling airflow in a datacenter comprising a hot aisle, a cold aisle adjacent to the hot aisle, a containment element separating the hot aisle from the cold aisle, one or more cold air outlets providing airflow to the cold aisle, and one or more heat-generating electronic devices positioned between the hot aisle and the cold aisle configured to take in cold air from the cold aisle and exhaust hot air to the hot aisle, the system comprising:
    an airflow sensing device installed in the containment element, the airflow sensing device comprising:
        a first insert comprising a frame that defines a first conduit in continuous fluid communication with the cold aisle and the hot aisle, the conduit having a first opening and a second opening, wherein the insert penetrates through the containment element; and
        a single temperature sensor positioned within the conduit, wherein the conduit is bent in an L-shaped manner within the cold aisle such that the first opening is spatially removed from a vicinity of the one or more cold air outlets, and the first opening is pointed away from the one or more cold air outlets;
    a controller comprising at least one processor and a tangible memory containing non-transitory instructions that, when executed by the processor, cause the controller to:
        detect a temperature of a flow of air within the conduit by the single temperature sensor;
        compare the temperature detected by the single temperature sensor with a threshold temperature; and
        determine a direction of the flow of the air through the conduit based on the comparison.

2. The system of claim 1, wherein the controller is further configured to:
    compare the temperature of the air within the conduit to a threshold temperature, wherein the threshold temperature is between a hot aisle temperature of the hot aisle and a cold aisle temperature of the cold aisle; and
    determine that the flow of air through the conduit is flowing from the hot aisle to the cold aisle based on the temperature of the air within the conduit exceeding the threshold.

3. The system of claim 1, wherein the temperature sensor is connected with an interior surface of the conduit.

4. The system of claim 1, wherein the conduit comprises a first substantially horizontal length of the conduit that terminates at the second opening within the hot aisle, and defining a second substantially vertical length of the conduit that terminates at the first opening within the cold aisle.

5. The system of claim 1, wherein the insert is configured for placement through the containment element and around the one or more heat-generating electronic devices, the insert comprising an L-shaped bend of the conduit defining a first substantially horizontal length of the conduit of at least 120 cm, and defining a second, substantially vertical length of the conduit of at least 30 cm.

6. The system of claim 1, further comprising:
    a second insert comprising a second frame that defines a second conduit, the second insert installed in the containment element and spaced apart from the first insert; and
    a second temperature sensor positioned within the second conduit, wherein the controller is further configured to:
        detect respective temperatures at each of the first temperature sensor and the second temperature sensor; and
        detect whether recirculation is occurring from the hot aisle to the cold aisle at each of the first conduit and the second conduit based on the respective temperatures.

7. The system of claim 1, wherein the controller is further configured to:

detect a reversed flow of air wherein a warm flow of air flows from the hot aisle to the cold aisle through the conduit, selectively cause the one or more cold air outlets to increase a flow rate of cold air to the cold aisle in response to detecting the reversed flow of air.

8. An airflow sensing insert, comprising:

a frame defining a conduit, wherein the conduit comprises a first opening and a second opening separated by a nonzero distance, the frame configured for placement in a dividing containment element between a hot aisle and a cold aisle to provide a continuous fluid connection between the hot and cold aisles, wherein the conduit comprises a first substantially horizontal length of the conduit that terminates at the second opening and a second substantially vertical length of the conduit that terminates at the first opening; and a single temperature sensor positioned within the conduit between the first opening and the second opening, the temperature sensor configured to detect a temperature of a flow of air flowing through the conduit.

9. The insert of claim 8, wherein the conduit has a length of at least 1 cm and an internal cross sectional area of less than 30 cm$^2$.

10. The insert of claim 8, further comprising a display element configured to receive temperature information from the temperature sensor and display the temperature information to a user.

11. The insert of claim 8, wherein the temperature sensor is mounted in the conduit within a central range of the conduit between the first opening and the second opening and between first and second stagnation points, wherein the first stagnation point is associated with airflow from the first opening to the second opening and the second stagnation point is associated with airflow from the second opening to the first opening.

12. The insert of claim 8, wherein the insert further comprises a sealing element extending from the frame and configured to interface with the containment element when the insert is installed in the containment element, the sealing element configured to mitigate airflow through the containment element around the frame.

13. The insert of claim 8, wherein the temperature sensor is a thermocouple.

14. The insert of claim 8, further comprising a controller comprising onboard memory and a processor configured to:

receive temperature data from the temperature sensor;

based on the temperature data, compare a temperature of the flow of air within the insert to a threshold temperature; and generate an indication of reversed airflow when the temperature of the flow of air exceeds the threshold temperature.

15. A method, comprising:

detecting a temperature of a flow of air, through a first insert installed in a containment element between a hot region and a cold region separated by the containment element, by only a single temperature sensor positioned within a conduit of the insert, wherein the insert comprises:

a frame that defines the conduit, the conduit being in continuous fluid communication with the cold region and the hot region, and the conduit having a first opening and a second opening; and the single temperature sensor positioned within the conduit, wherein the conduit is bent in an L-shaped manner within the cold region such that the first opening is spatially removed from a vicinity of one or more cold air outlets of the cold region, and the first opening is pointed away from the one or more cold air outlets;

comparing the temperature detected by the temperature sensor with a threshold temperature;

determining, based on the comparison, a direction of the flow of air between the hot region and the cold region; and detecting recirculation from the hot region to the cold region based on the direction of the flow of air.

16. The method of claim 15, wherein determining the direction of the flow of air comprises:

determining that the flow of air is circulating from the cold region to the hot region based on the temperature being less than the threshold temperature; and determining that the flow of air is recirculating from the hot region to the cold region based on the temperature being greater than or equal to the threshold temperature.

17. The method of claim 16, further comprising:

detecting at least one of a hot region temperature or a cold region temperature by one or more hot or cold region temperature sensors positioned outside the conduit; and determining the threshold temperature based on at least one of the hot region temperature or cold region temperature.

18. The method of claim 15, further comprising:

detecting a second temperature, by a second temperature sensor positioned within a second conduit of a second insert installed in the containment element separated from the first insert;

determining first and second airflow directions corresponding to the respective first and second inserts based on the temperatures by comparing each temperature to a threshold temperature; and detecting recirculation at one of the first insert or second insert based on the determined airflow directions.

19. The method of claim 18, further comprising:

causing an adjustment mechanism to selectively increase a rate of airflow from one air outlet relative to rates of airflow from a remainder of a plurality of air outlets in the cold region, the one air outlet selected from the plurality of air outlets based on proximity of the one air outlet to the one of the conduits at which recirculation is detected.

20. The method of claim 18, further comprising:

polling an adjustment mechanism corresponding to the one of the conduits at which recirculation is detected to determine whether a local rate of airflow can be increased by opening an air outlet;

if the local rate of airflow cannot be increased at the air outlet, causing a general rate of airflow to be increased to the air outlet; and if the local rate of airflow can be increased at the air outlet, causing the adjustment mechanism to further open the air outlet to increase the local rate of airflow from the air outlet with respect to a plurality of local rates of airflow from a plurality of air outlets in the cold region.

21. The method of claim 15, further comprising:

comparing the temperature of the flow of air in the conduit to a threshold temperature;

selectively decreasing a flow rate of a cooling flow of air to the cold region in response to detecting that the temperature of the flow of air in the conduit is below the threshold; and selectively increasing the flow rate of the cooling flow of air to the cold region in response to detecting that the temperature of the flow of air in the conduit is above the threshold.

22. The system of claim 1, further comprising a plurality of inserts including the insert, and a plurality of cold air outlets including the one or more cold air outlets, wherein the instructions are further configured to cause the controller to:

detect recirculation at the insert based on a determination that the direction of the flow of the air through the conduit corresponding to the insert is reversed; and cause an adjustment mechanism to selectively increase a rate of airflow from one cold air outlet relative to rates of airflow from a remainder of the cold air outlets providing airflow to the cold aisle, the one cold air outlet selected from the plurality of cold air outlets based on proximity of the one cold air outlet to the insert at which recirculation is detected.

23. The system of claim 11, wherein the conduit defines a first, substantially horizontal portion that penetrates through the containment element and a second, substantially vertical portion oriented parallel to the containment element.

24. The system of claim 11, wherein the insert is removably attached to the containment element.

\* \* \* \* \*

UNITED STATES PATENT AND TRADEMARK OFFICE
CERTIFICATE OF CORRECTION

| | | |
|---|---|---|
| PATENT NO. | : 10,736,241 B1 | Page 1 of 1 |
| APPLICATION NO. | : 15/872596 | |
| DATED | : August 4, 2020 | |
| INVENTOR(S) | : Alan Joseph Lachapelle et al. | |

It is certified that error appears in the above-identified patent and that said Letters Patent is hereby corrected as shown below:

In the Claims

Column 21, Line 20, Claim 23:
Delete: "The system of claim 11, wherein the conduit defines"
Insert - --The system of claim 1, wherein the conduit defines--

Column 21, Line 24, Claim 24:
Delete: "The system of claim 11, wherein the insert is"
Insert - --The system of claim 1, wherein the insert is--

Signed and Sealed this
Twenty-seventh Day of April, 2021

Drew Hirshfeld
*Performing the Functions and Duties of the*
*Under Secretary of Commerce for Intellectual Property and*
*Director of the United States Patent and Trademark Office*